United States Patent [19]

Cheng

[11] Patent Number: 5,523,582
[45] Date of Patent: Jun. 4, 1996

[54] METHOD AND APPARATUS FOR MEASURING THE CURVATURE OF WAFERS WITH A LASER SOURCE SELECTING DEVICE

[75] Inventor: David Cheng, Sunnyvale, Calif.

[73] Assignee: Ann F. Koo, Los Altos, Calif.

[21] Appl. No.: 142,591

[22] Filed: Oct. 22, 1993

Related U.S. Application Data

[63] Continuation-in-part of Ser. No. 876,576, Apr. 30, 1992, Pat. No. 5,270,560.

[51] Int. Cl.$^6$ .................................................. G01N 21/86
[52] U.S. Cl. ............................ 250/559.22; 250/559.27; 356/376
[58] Field of Search ................................. 250/561, 560, 250/226, 201.5, 559.22, 559.27; 356/371, 376, 382, 35.5, 420, 328; 362/231, 230, 293; 372/23, 24, 26, 28; 369/44.29–44.41

[56] References Cited

U.S. PATENT DOCUMENTS

| | | | |
|---|---|---|---|
| 4,432,239 | 2/1984 | Bykov | 356/35.5 |
| 4,566,797 | 1/1986 | Kaffka et al. | 356/420 |
| 4,667,316 | 5/1987 | Suda et al. | 369/44.38 |
| 5,029,245 | 7/1991 | Keränen et al. | 356/328 |
| 5,134,303 | 7/1992 | Blech et al. | 250/560 |
| 5,248,889 | 9/1993 | Blech et al. | 250/561 |

*Primary Examiner*—Que T. Le
*Attorney, Agent, or Firm*—Hickman Beyer & Weaver

[57] ABSTRACT

A method and apparatus for measuring the curvature of a wafer. The apparatus includes a laser head that includes multiple laser sources that each emit a laser beam, each beam having a different wavelength. A CPU selects one of the sources to emit a beam. The beam is directed through a lens within the laser head and onto a surface of a wafer. The beam is reflected from the surface of the wafer and detected by a detector. The present invention includes a motor to cause relative motion between the laser head and the wafer such that the beam scans across the surface of the wafer, relaying data to the detector and the CPU. The CPU calculates the curvature of the wafer surface using the scanned data. The CPU selects a different laser source to direct a beam having a different wavelength at the wafer surface to avoid destructive interference that may occur with previously-used wavelengths. Other embodiments include the laser sources within a carousel apparatus, and the addition of a beamsplitter to transmit and reflect selected beams onto the wafer surface.

24 Claims, 9 Drawing Sheets

METHOD AND APPARATUS FOR MEASURING THE CURVATURE OF WAFERS WITH A LASER SOURCE SELECTING DEVICE

CROSS REFERENCE TO RELATED APPLICATIONS

This application is a continuation-in-part of parent patent application Ser. No. 07/876,576, filed Apr. 30, 1992 on behalf of David Cheng, entitled, "Method and Apparatus for Measuring Surface Topography", now U.S. Pat. No. 5,270,560, which is hereby incorporated by reference herein.

BACKGROUND OF THE INVENTION

1. Field of the Invention

This invention relates to semiconductor manufacturing, and more particularly to measuring surface curvature of semiconductor wafers.

2. Background of the Related Art

Integrated circuits are formed on semiconductor wafer substrates by a number of processing steps. These steps include deposition, etching;, implantation, doping, and other semiconductor processing steps well known to those skilled in the art.

Thin films are typically formed on wafer surfaces by a deposition process. The thickness of such films usually ranges from about a few hundred angstroms to several micrometers. Often, three or more film layers are formed on the surface of a single semiconductor wafer.

In the art of fabricating semiconductor wafers, it is of known importance to minimize or control stresses in surface films. High surface stresses can cause, for example, silicide lifting, the formation of voids or crack and other conditions that adversely affect semiconductor devices (i.e. chips) which are fabricated on the wafers. In practice, surface stresses become more problematical as the level of circuit integration increases, and are especially troublesome when fabricating large scale integration (LSI), very large scale integration (VLSI), and ultra large scale integration (ULSI) semiconductor devices.

The stress in the surface film of a semiconductor wafer can be either compressive or tensile. Assuming the film is on top of the wafer, a compressive stress in a surface film will cause a wafer to slightly bow in a concave direction, while a tensile stress in a surface film will cause a wafer to slightly bow in a concave direction. Therefore, both compressive and tensile stresses cause the surface of the semiconductor wafer to deviate from exact planarity. The extent of the deviation from planarity can be expressed in terms of the radius of curvature of a wafer surface. In general, the greater the magnitude of surface stress, the smaller the radius of curvature.

Because of the problems that can be caused by stresses in surface films on semiconductor wafers, it is highly desirable to be able to measure such stresses. The measurements can be used, for example, to identify wafers that are likely to provide low yields of semiconductor devices or which might produce devices prone to early failure. In normal practice, stresses in surface films are not measured directly but, instead, are inferred from measurements of the radius of curvature of the surface of interest.

A system for measuring the curvature of a workpiece, such as a wafer, is described in copending patent application Ser. No. 07/876,576, filed on behalf of David Cheng, entitled "Method and Apparatus for Measuring Surface Topography", now U.S. Pat. No. 5,270,550, which was incorporated herein by reference. This system reflects a guided beam of radiant energy, such as one generated by a laser, from a surface film of a workpiece. A detector detects a portion of the reflected beam; as the wafer or laser is moved, the deviation of the beam from a point at the detector is recorded and analyzed to detect curvature of the surface.

A problem encountered with this system is that the amplitude of the beam of energy reflected from the surface film of the workpiece can be reduced due to destructive interference. The interference is caused by reflection from the surface film on the workpiece, which includes an upper surface boundary and a lower surface boundary. A beam of light is partially reflected and partially transmitted through the upper film boundary. The transmitted portion of the beam is reflected by the lower film boundary and interferes with the first reflected portion of the beam due to well-known optical interference principles. The thickness of the surface film can cause the second reflected portion of the beam to be out-of-phase with the first reflected portion, and destructive interference in the entire beam can result. Destructive interference may weaken or almost completely cancel the amplitude of the reflected beam of energy, causing difficulties in detecting the reflected beam and resulting in errors in the curvature testing process.

In U.S. Pat. No. 5,134,303, by Blech et al., a dual frequency laser apparatus for measuring stress in a thin film is disclosed. A laser beam composed of two different wavelengths is directed onto a surface with a thin film and reflected to a detector. If one of the wavelengths permits destructive interference to occur in the reflected beam, the other transmitted wavelength may not, and the reflected beam can be detected. Two separate laser beams, each of a distinct wavelength, are combined into the dual-wavelength beam by a beamsplitter to accomplish this goal.

A problem with the prior art dual frequency laser apparatus is that a beam of multiple wavelengths is directed at a thin film surface. Both laser sources are required to concurrently project energy in a beam of multiple wavelengths, requiring both lasers to be concurrently powered and maintained. A waste of energy is thus evident.

What is needed is an apparatus and method that will reduce the problem of destructive interference that occur in surface film curvature measurement and also reduce the inefficiency of using combined, multiple-frequency energy sources to measure thin films.

SUMMARY OF INVENTION

The present invention addresses the problems of the prior art by providing a method and apparatus to measure the curvature of a workpiece by selecting one of several light sources to emit a laser beam. One source is selected at any one time to create the beam. The wavelengths of the beams are different so that at least one of the beams is, in many cases, not significantly reduced in amplitude by destructive interference when reflected from a thin film on the workpiece surface.

The apparatus includes a laser head that includes multiple sources of electromagnetic radiation that emit the radiation in a beam, such as a laser beam. Each beam has a different wavelength. A CPU or similar controller apparatus selects one of the sources to emit a beam. The beam is directed through a lens within the laser head and onto a surface of a workpiece, such as a wafer. The beam is reflected from the surface of the workpiece and detected by a detector. The CPU is connected to the detector and receives information from the detector relating to the position of the beam on the surface of the workpiece. The present invention preferably includes a motor to cause relative motion between the laser head and the workpiece such that the beam is scanned across tile surface of the workpiece, relaying information to the detector and the CPU. The beam can be moved across the workpiece, or the workpiece can be translated while the beam remains stationary to scan the beam across the surface.

The CPU calculates the curvature of the workpiece surface using the scanned data received from the detector. If the data received from the detector is judged inaccurate or unreliable by the CPU, the CPU selects a different laser source to direct a beam having a different frequency at the wafer surface to avoid the destructive interference that occurred using the previous wavelength.

The present invention preferably includes multiple mirrors that reflect a beam to the detector, each mirror corresponding to a laser source. In the preferred embodiment, a laser source and corresponding lens is incorporated within a laser "pen" structure that allows the lens to be moved to focus the laser beam. In alternate embodiments, the laser sources are incorporated within a carousel that rotates a specific laser source into position to direct a beam at the workpiece surface. In another embodiment, a polarizing beamsplitter is preferably positioned to transmit a beam from one laser source and reflect a different beam from a different laser source onto the workpiece surface; the apparatus preferably uses a single mirror to direct the beam to the detector. In yet another embodiment, the CPU selects one laser source at a time to scan first a blank wafer and then to secondly scan a wafer deposited with a thin film in order to eliminate inherent wafer curvature effects in the curvature calculations.

The present invention has the advantage of selecting one source at a time to direct a beam at a workpiece surface to measure curvature, thereby reducing the continuous, concurrent use of all laser sources, and, in many cases, eliminating the use of one or more sources.

This and other advantages of the present invention will become apparent to those skilled in the art after reading the following descriptions and studying the various figures of the drawings.

DETAILED DESCRIPTION OF THE PREFERRED EMBODIMENTS

Figure 1:
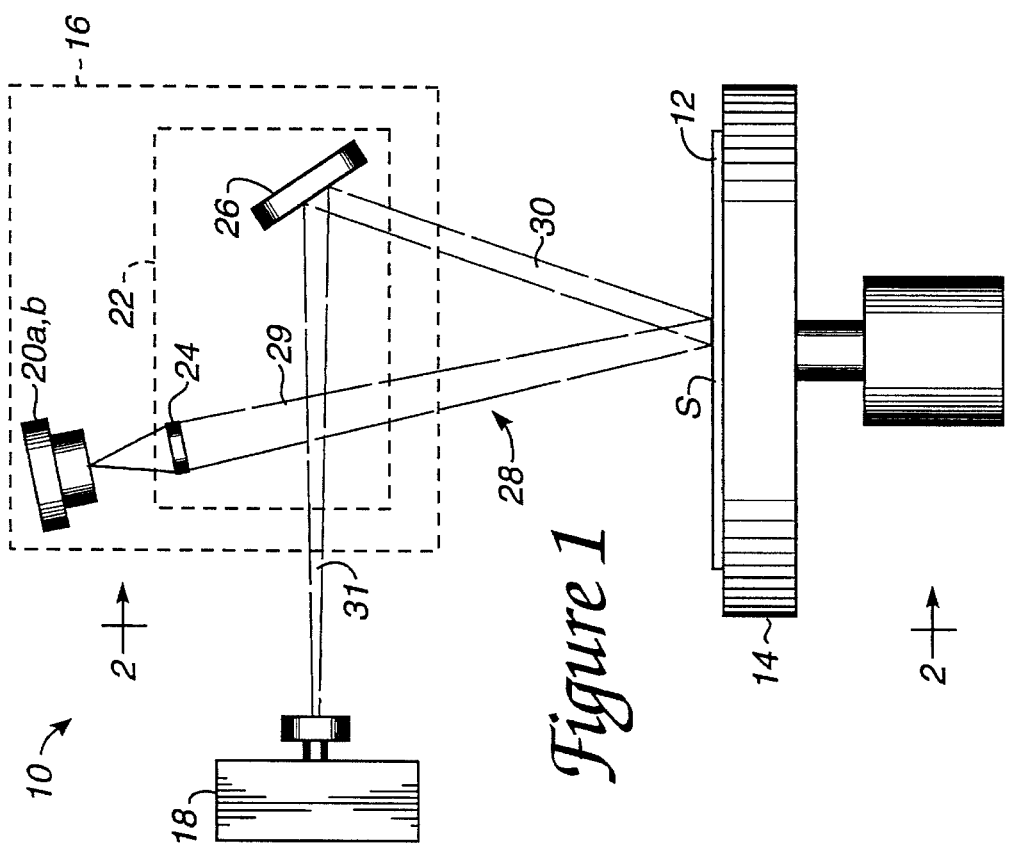
FIG. 1 is a side elevational view of an apparatus to measure curvature of the present invention.

FIG. 1 is a side elevational view of a preferred embodiment of an apparatus 10 for measuring the curvature of a wafer in accordance with the present invention. A wafer 12 to be measured for curvature rests on a pedestal 14 and includes an upper surface S. While the present invention will be discussed in terms of measuring the curvature of a semiconductor wafer, such as wafer 12, it should be understood that this invention can be used to non-destructively measure the surface topography of a variety of workpieces, including hard disk platters, optical blanks, etc. As used herein, "topography" refers to any description of a surface of a workpiece, such as curvature, contours, etc.

Apparatus 10 includes a multiple frequency laser head 16 and a beam detector 18. Laser head 16 includes laser sources 20 and a beam directing apparatus 22.

Laser sources 20 are multiple laser sources, each preferably a Class IIIb laser product certified by the Federal Food and Drug Administration under FDA 27 CFR 1040, 10(f)(5)(ii). In the described embodiment, there are two laser sources, 20a and 20b that preferably operate at wavelengths of approximately 810–830 nm and 670–750 nm, respectively (see also FIG. 2 for position of laser sources). A typical maximum power output of the laser sources 20a and 20b is less than 2 mW.

Beam directing apparatus 22 preferably includes a lens 24 and a mirror 26. Lens 24 is preferably a converging lens that has a focal length which allows a beam 28 produced by a laser source 20 to form a beam spot on wafer surface S of wafer 12 and beam detector 18. The beam spot formed on the wafer surface preferably should be about 3 mm in diameter, and the beam spot formed on the beam detector should be about 20–50 μm in diameter. Mirror 26 is preferably a front silvered mirror that directs the beam to beam detector 18 after it has been reflected from surface S. A laser source 20a and 20b forms an incident beam 29 which impinges upon the surface S of the wafer 12. The surface S of the wafer reflects a portion of the incident beam 29 as a reflected beam 30. The reflected beam 30 impinges upon the reflective surface of mirror 26 and is reflected towards the beam detector 18 as a directed beam 31. Therefore, beam 28 comprises the sum of beams 29, 30, and 31. The effective reflected beam path length comprising beams 30 and 31 is about 300 mm.

Figure 2:
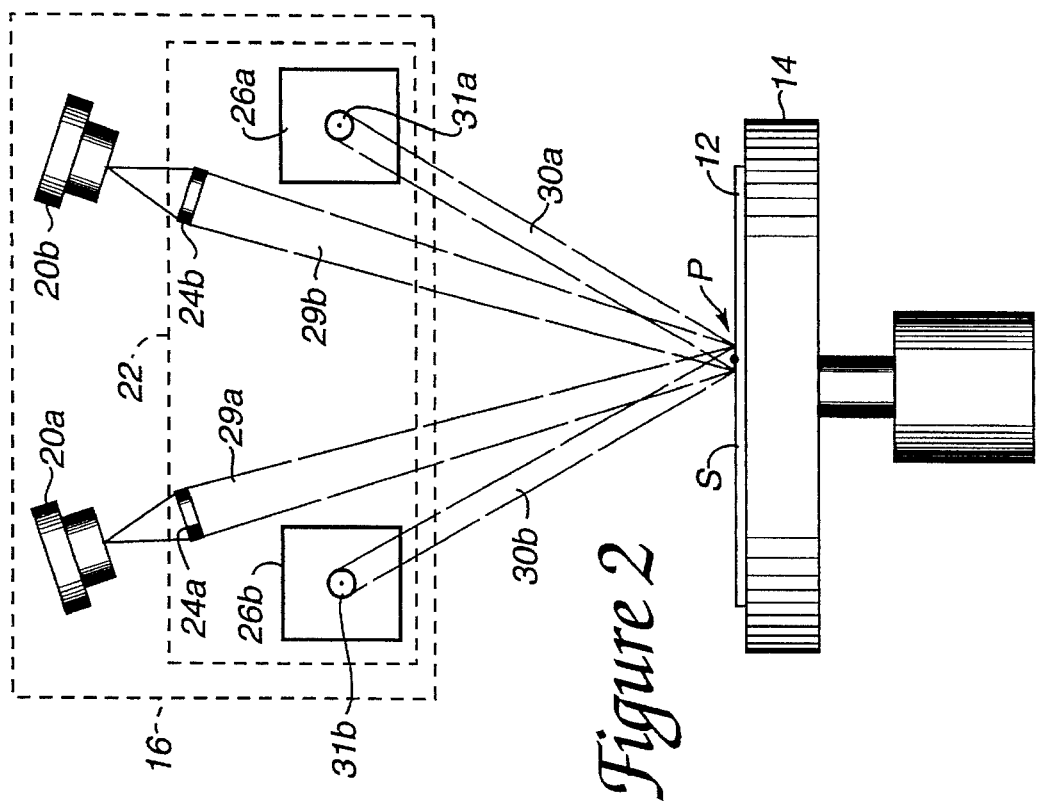
FIG. 2 is a front elevational view taken along line 2—2 of the apparatus shown in FIG. 1.

FIG. 2 is a side elevational view of the laser head 16 and wafer 12 taken along line 2—2 of FIG. 1. Laser sources 20a and 20b are positioned on opposite sides from a point P on the wafer surface. Each laser source is oriented so that an incident beam 29a or 29b will be directed at the point P. Beams 30a and 30b are reflected from the surface of the wafer, and beams 31a and 31b are directed at the beam detector 18 (out of the plane of the drawing). Beam 28a is thus composed of incident beam 29a, reflected beam 30a, and directed beam 31a. Beam 28b is correspondingly composed of incident beam 29b, reflected beam 30b, and directed beam 31b.

Figure 3:
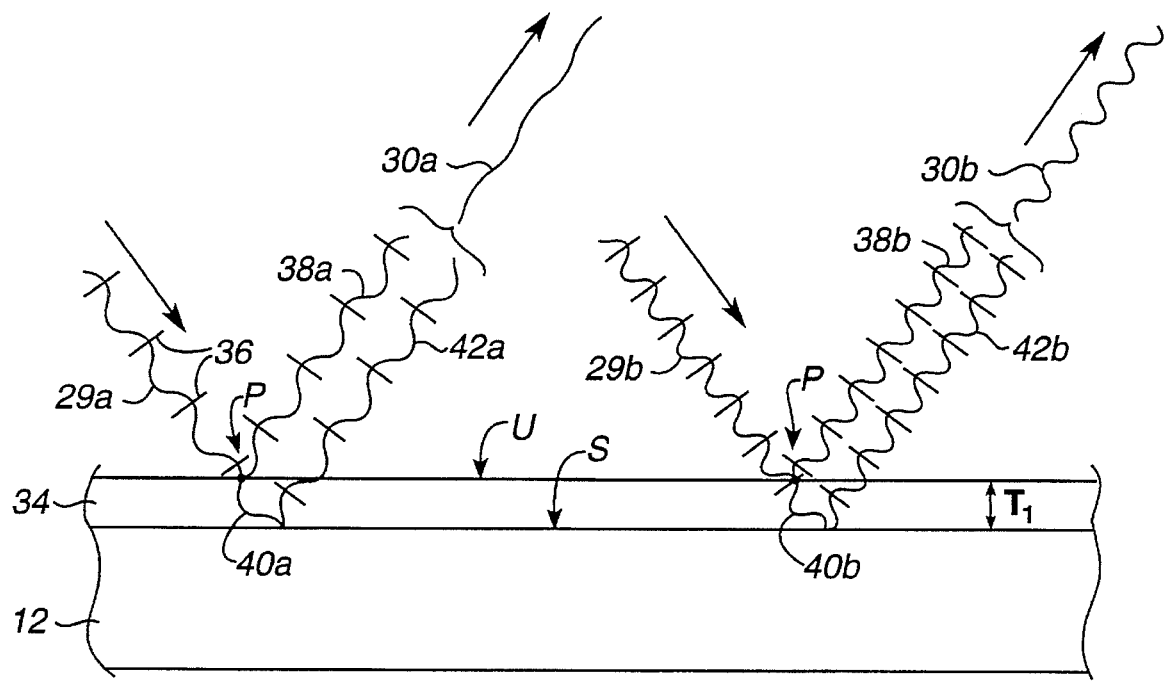
FIG. 3 is a side view of laser beams of two different wavelengths reflected from a thin film on a wafer surface.

FIG. 3 is a schematic diagram illustrating the reflection of incident beams 29a and 29b from the wafer surface S and a thin film 34. FIG. 3 shows a side view of wafer 12 that has been coated with a thin film 34 having a thickness $T_1$ and an upper surface U. Upper surface S of the wafer supports thin film 34. The incident laser beam 29a from laser source 20a includes wave fronts 36 and has a first wavelength. Incident beam 29a is directed at the wafer at a point P. A portion 38a of beam 29a is reflected from the upper surface U of the thin film and a portion 40a continues to transmit through the thin film 34. Portion 40a impinges on the boundary of wafer surface S and thin film 34 and a portion 42a is reflected from surface S. Portion 42a emerges from thin film 34 (after another small amount of reflection again at surface U) proximate to reflected portion 38a. Reflected portions 38a and 42a both originated from the same laser source 20a and are coherent; a phase difference exists between the two portions due to the different lengths traveled, different mediums traveled through, and different interfaces encountered. Interference will thus occur between portions 38a and 42a; the amount and type (destructive or constructive) of interference depends on the amount of phase difference between the two portions. Portions 38a and 42a in FIG. 3 are almost 180 degrees out of phase, and thus almost completely cancel each other out. The small amplitude of resulting reflected beam 30a shows this destructive interference; reflected beam 30a is difficult to detect in detector 18.

FIG. 3 also shows incident beam 29b directed at wafer 12 covered with thin film 34 having the same thickness $T_1$. Beam 29b has a distinctly different wavelength than incident beam 29a. Reflected portions 38b and 42b constructively interfere, resulting in a larger amplitude for reflected beam 30b than for beam 30a. Incident beam 29b thus has a wavelength that will allow beam detector 18 to detect a beam reflected from a thin film of thickness of $T_1$.

Figure 4:
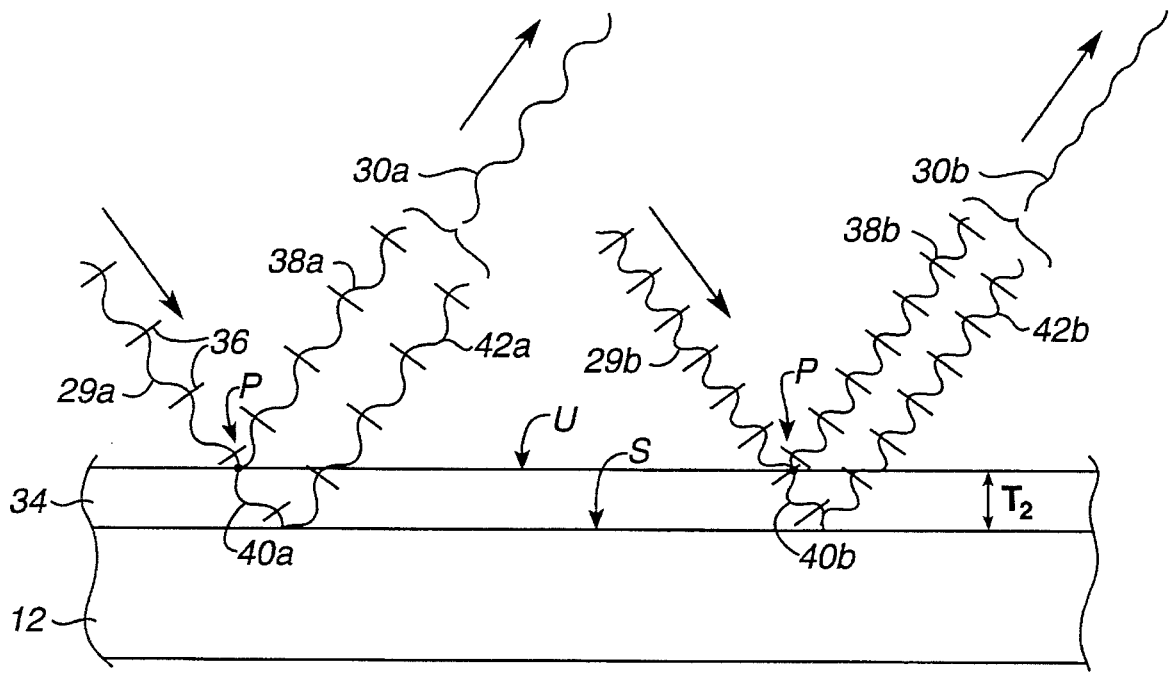
FIG. 4 is a side view of laser beams reflected from a thin film having a different thickness from the thin film of FIG. 3.

FIG. 4 is a schematic diagram illustrating the reflection of incident beams 29a and 29b from a different thin film. Thin film 34 has a thickness $T_2$, which is different from thin film thickness $T_1$ shown in FIG. 3. Here, incident beam 29a has a portion 38a reflected from surface F of thin film 34 and a portion 42a reflected from the surface S of wafer 12. Portions 38a and 42a constructively interfere to produce a reflected beam 30a with about the same amplitude as beam 29a. In contrast, incident beam 29b has the same wavelength as beam 29b in FIG. 3, but produces two reflected portions 38b and 42b that destructively interfere and cause a beam 30b with smaller amplitude to be reflected. It is thus advantageous to use both beams 29a and 29b with different wavelengths to determine which wavelength produces a reflected beam 30 with the highest amplitude.

Figure 5:
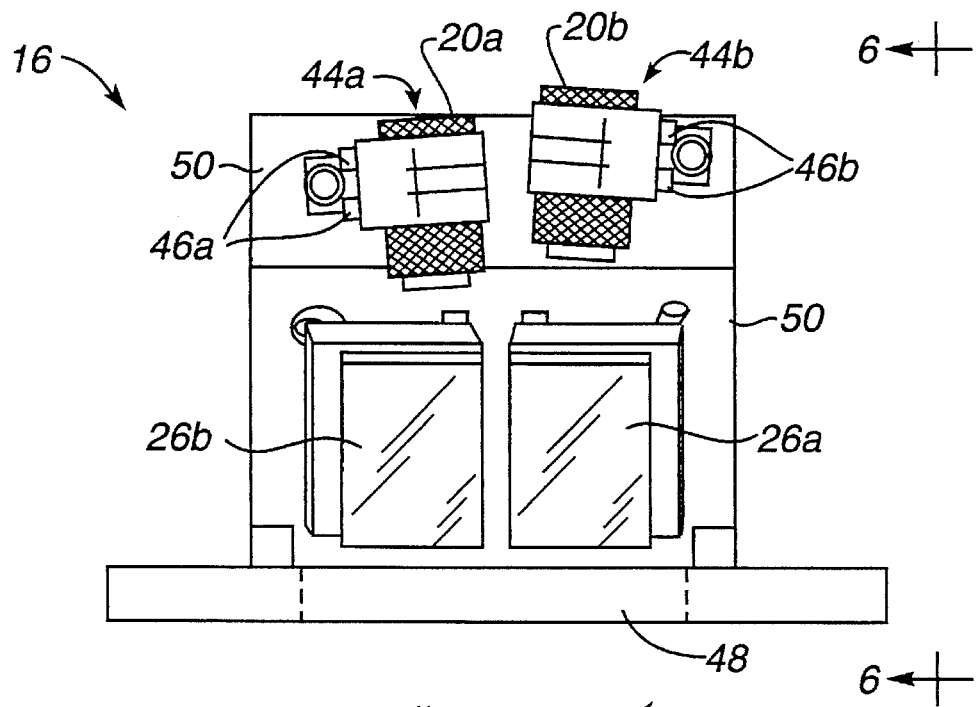
FIG. 5 is a front elevational view of a preferred implementation of a laser head of the present invention.

FIG. 5 is a front view of a preferred multi-frequency laser head 16 of apparatus 10 shown in FIGS. 1 and 2. Laser sources 20a and 20b and lens 24a and 24b are shown included within laser "pens" 44a and 44b (detailed with reference to FIG. 7). Knobs 46a and 46b can be adjusted by the operator to tighten laser pens 44a and 44b and fix the focus of the projected laser beams. Laser beams are directed through opening 48 provided in the bottom base of a frame 50 supporting laser pens 44a and 44b and mirrors 26a and 26b. The beam is reflected from a wafer surface below laser head 16 and is reflected back to mirrors 26a and 26b. Mirrors 26a and 26b are positioned below laser pens 44a and 44b. In the preferred embodiment, wafer 12 is positioned about 2–4 inches below laser pens 44a and 44b.

Figure 6:
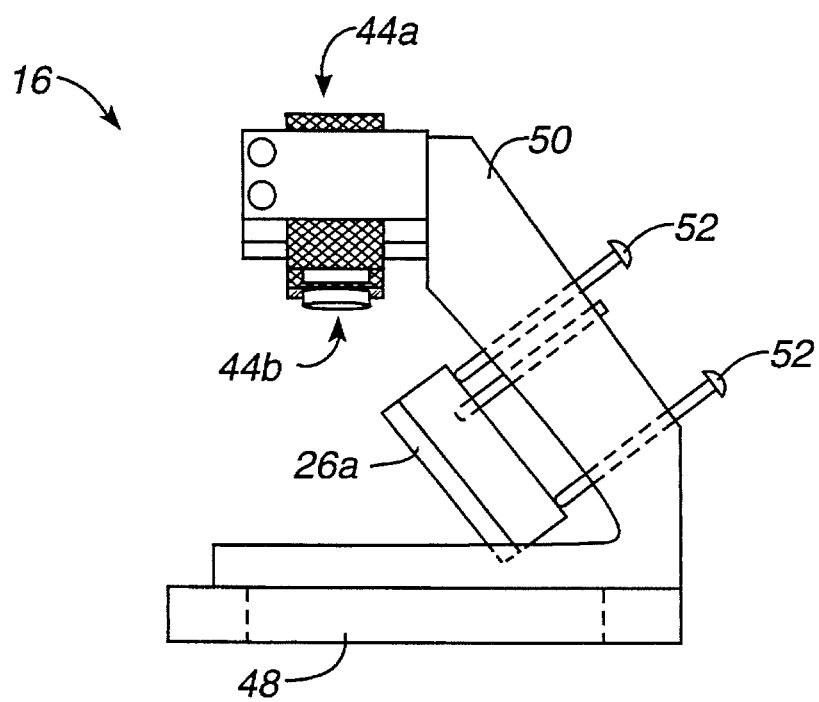
FIG. 6 is a side elevational view taken along line 6—6 of the laser head shown in FIG. 5.

FIG. 6 is a side elevational view of the laser head taken along line 6—6 of FIG. 5. Adjustment screws 52 are positioned behind mirrors 26a and 26b. Screws 52 can be moved in towards mirrors 26a and 26b or out away from the mirrors to adjust the angle of mirrors 26a and 26b. The mirrors are adjusted to align the directed beam 31 with the beam detector 18, as shown in FIG. 1.

Figure 7:
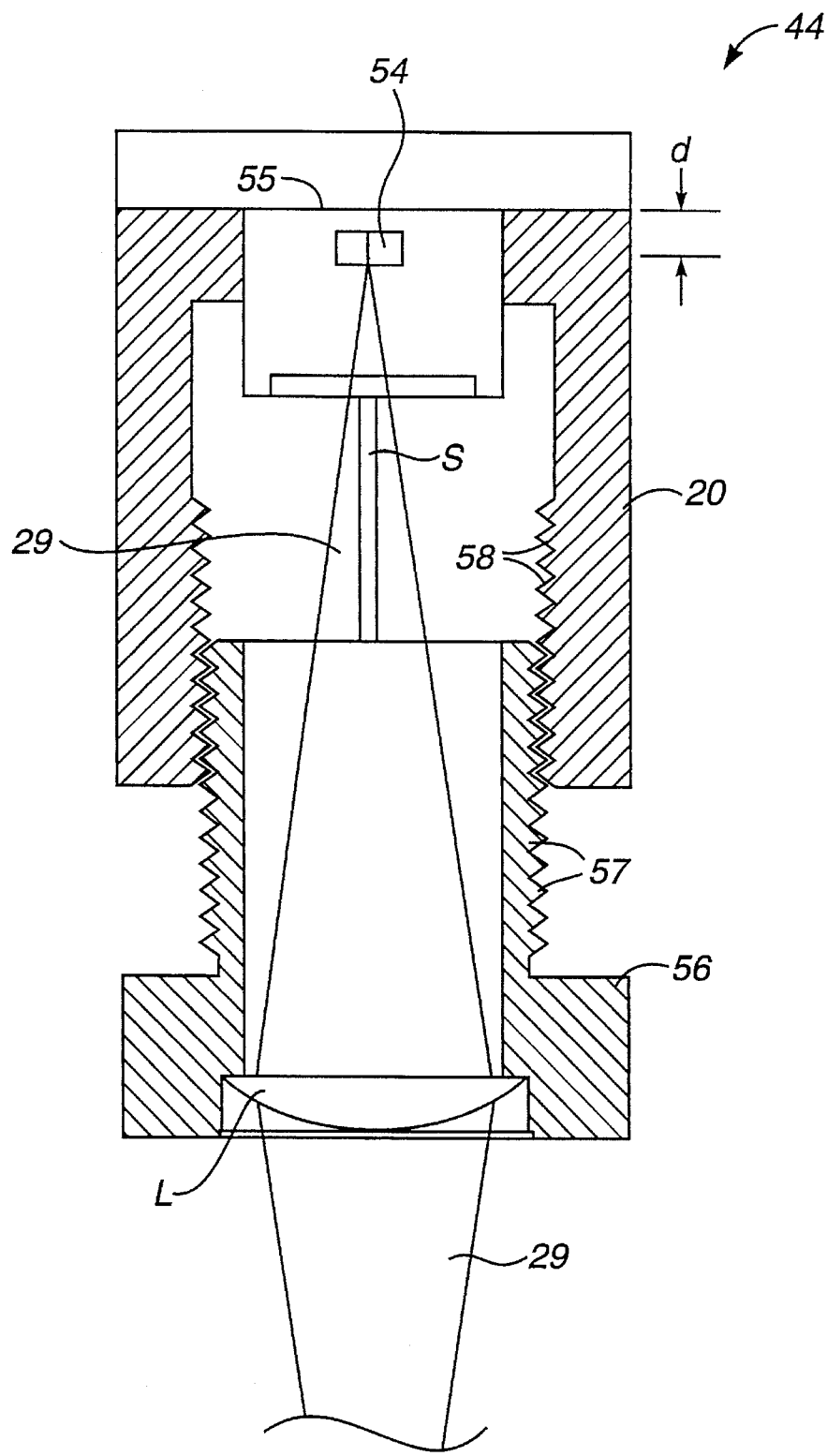
FIG. 7 is a cross section of a preferred laser "pen" used in the present invention.

FIG. 7 is a cross-sectional view of a preferred embodiment of a laser pen 44 shown in FIGS. 5 and 6. Diode laser element 54 is positioned in a laser source barrel 20 of laser pen 44 at a fixed distance d from the surface 55 of the laser pen. The barrel 20 is provided with a pair of splits S. Beam 29 emanates from a PN junction of the diode laser element 54 and is focused by a lens L of the laser pen. Lens L is supported by a barrel 56 that has screw threads 57 which can engage threads 58 on laser source barrel 20. The focus of the pen 44 can be adjusted by rotating the barrel 56 to cause the lens L to move forward or away from the diode laser 54. Knobs 46 (shown in FIGS. 5 and 6) are tightened by an operator to clamp barrel 20 to barrel 56 by squeezing the barrel 20 such that it compresses due to slits S and grips the inner barrel 56.

Figure 8A:
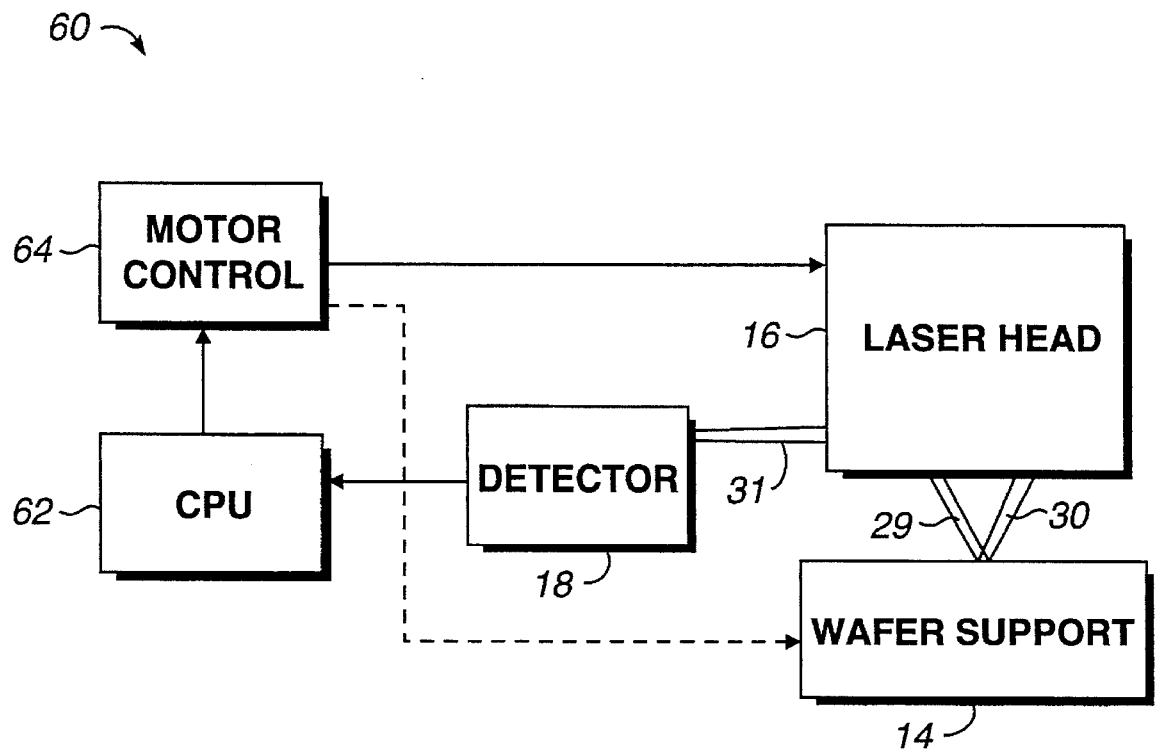
FIG. 8a is a block diagram of the control system used in the present invention.

FIG. 8a is a block diagram 60 showing a preferred control system for the present invention. A central processing unit (CPU) 62 is connected to a motor control circuit 64, which controls the movement of laser head 16. CPU 62 is preferably a microprocessor, such as an Intel 80386 of an IBM-compatible personal computer. Laser head 16 is preferably directed to translate within the x-y plane so that laser sources 20a and 20b can scan a beam 29a and 29b onto wafer 12 while wafer support 14 remains stationary. Such motor control circuitry and translation apparatus are discussed in co-pending patent application Ser. No. 07/876,576, now U.S. Pat. No. 5,270,560.

Alternatively, CPU 62 and motor control circuit 64 can direct wafer support 14 to translate in the x-y plane (shown by the broken line) while laser head 16 remains stationary. Wafer support 14 is moved using a similar well known apparatus to the embodiment described above. Wafer support 14 can also be rotated by a spindle and stepper motor within the x-y plane to provide additional translation.

Laser head 16 directs an incident beam 29 onto the wafer 12 and reflects the returning reflected beam 30 at detector 18 as directed beam 31. Detector 18 reads the position of the beam and relays the information to CPU 62. As incident beam 29 is scanned across the surface of the wafer, CPU 62 thus receives the data describing the topography of the wafer surface. CPU 62 then processes the received data to calculate a curvature measurement for the scanned area on wafer 12. Multiple scanned areas can be implemented to provide CPU 62 with additional data to calculate a more accurate curvature of the wafer surface. A method for both detecting a beam, scanning a beam across a wafer, and calculating a curvature measurement from scanned data is described in copending patent application Ser. No. 07/876,576 now U.S. Pat. No. 5,270,560 by D. Cheng, assigned to the same assignee and incorporated by reference herein.

Figure 8B:
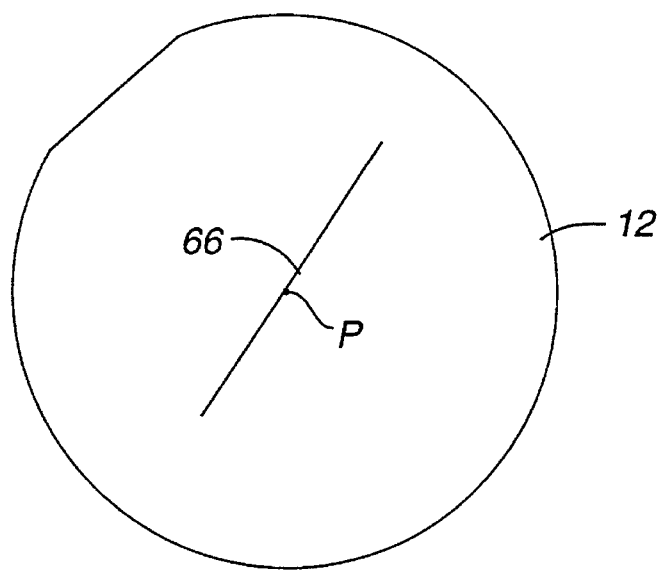
FIG. 8b is an overhead view of a scan line formed on a wafer surface by the laser head of the present invention.

FIG. 8b is a top view of wafer 12 and a scanning path 66 for beam 29. Relative motion in the x-y plane between laser head 16 and wafer support 14 can be provided using well known components as described with reference to FIG. 8a. Incident beam 29 can follow a scan line 66 across the wafer surface. The scan line 66 is, essentially, a series of points P linearly arranged on the surface of wafer 12. As the beam 29 is scanning, the position of reflected beam 30 at various points P along scan line 66 can be detected by detector 18 and stored by CPU 62 as data to calculate surface curvature. For example, the CPU can sample points along a scan line 66 at a predetermined sampling rate to provide a set of data. Beam 29 can be directed to follow a different scan line 66 to provide another set of data describing the curvature of the wafer surface by rotating the support 14 or the laser head 16.

The scan of beam 29 can follow a linear scan line 66 as shown in FIG. 8b or other patterns. If wafer support 14 is coupled to a spindle and motor for rotation, beam 29 can follow circular scan lines across the surface of wafer 12.

Figure 9A:
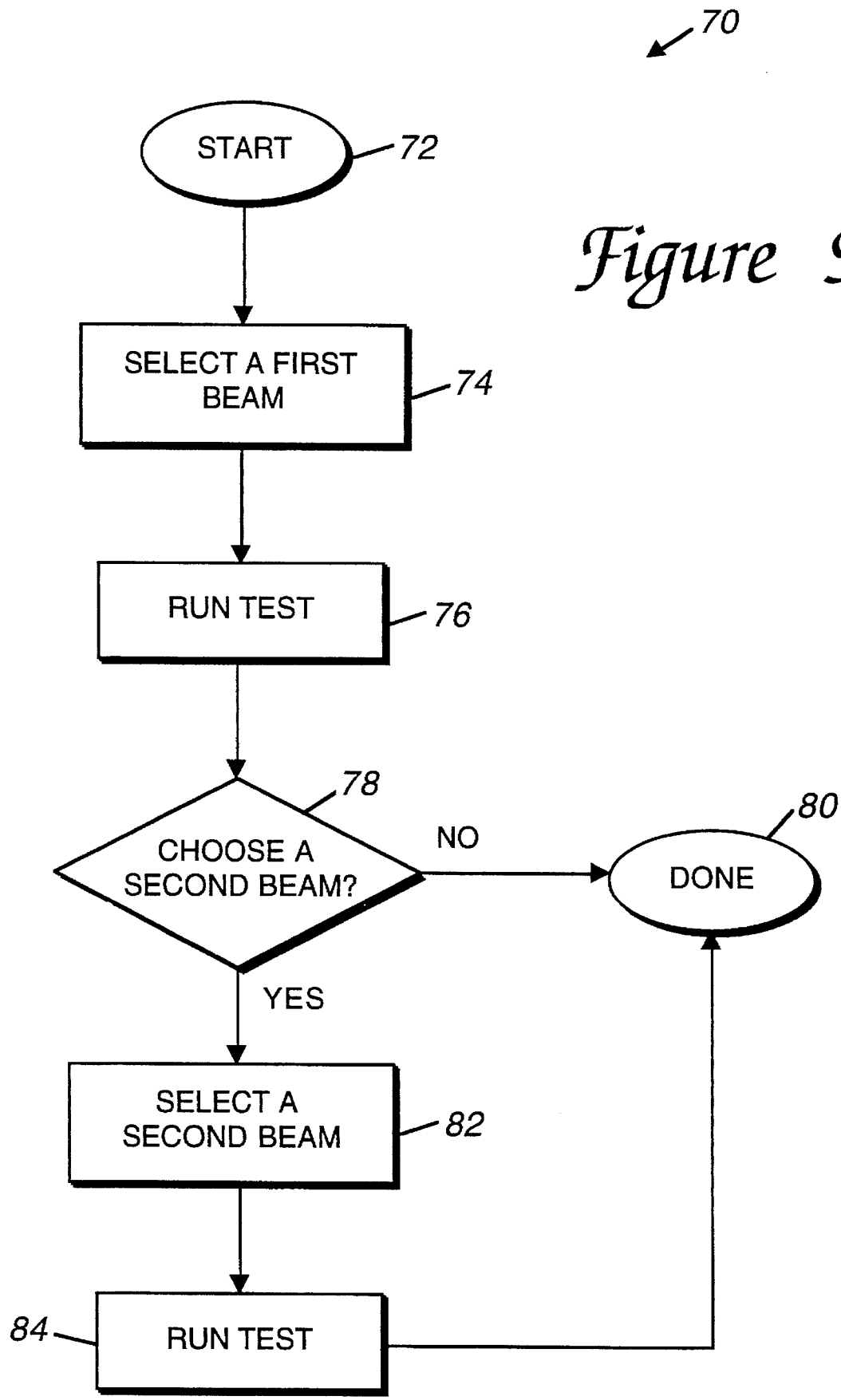
FIG. 9a is a flow diagram of a preferred method of the present invention.

FIG. 9a is a flow diagram 70 showing a preferred method of the present invention to measure the curvature of a workpiece. The process begins at step 72, and, at step 74, a first laser source 20a is selected by CPU 62 to transmit a first beam 29a of a particular wavelength. In step 76, the curvature test described above is implemented. The CPU calculates a curvature measurement from data obtained by scanning the first beam across the wafer surface.

The CPU determines in step 78 whether the first beam 29a has provided valid data, i.e. if the beam has suffered destructive interference or not. The CPU can compare the data received by detector 18 to a predetermined minimum threshold amplitude to determine if the data is above the minimum and within a predetermined operating range. If the data is determined to be valid, then the process is complete at step 80. If the data amplitude is determined to be below the predetermined minimum level (the first beam suffered destructive interference), then the process continues to step 82. In step 82, the CPU selects a second laser source 20b to transmit a beam 29b having a different wavelength than the first beam selected. In step 84, the curvature measurement test is implemented with the second beam. The CPU calculates the curvature of the wafer surface using the second set of data and the process is complete as indicated in step 180.

If further laser sources providing laser beams of differing wavelengths are used in other embodiments, the CPU can continue to select other laser sources if the data resulting from the second is below an accuracy threshold.

Figure 9B:
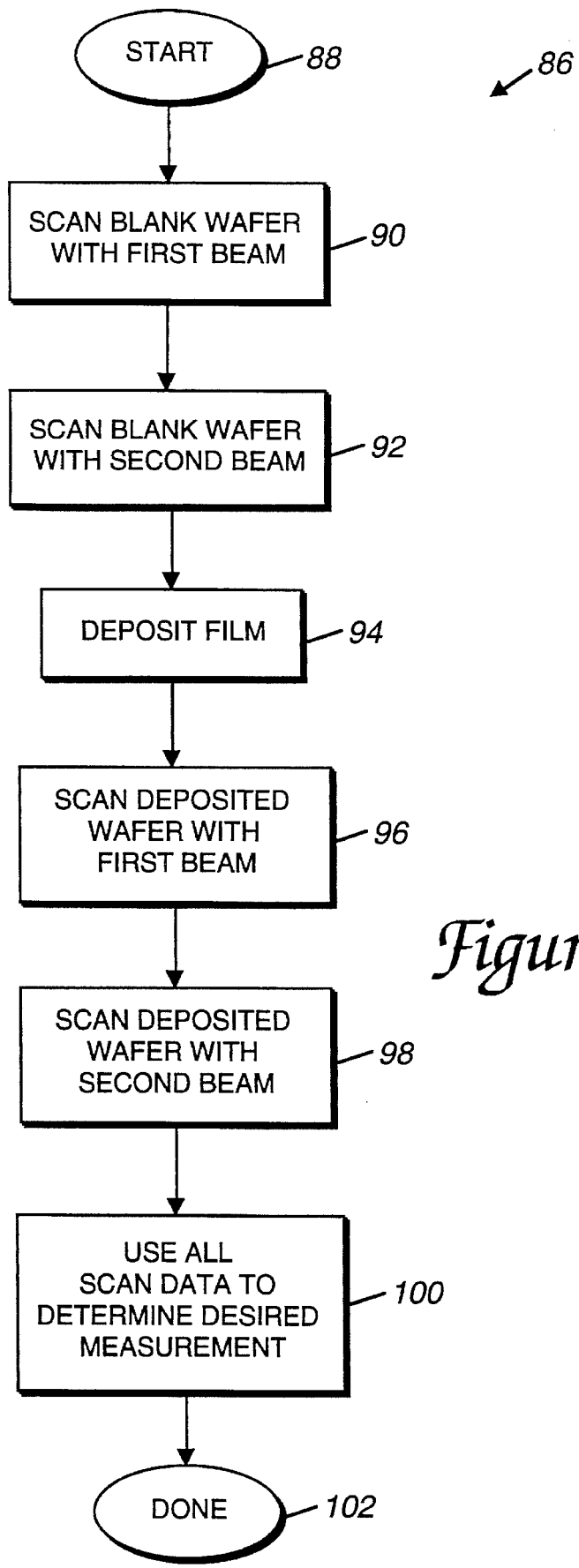
FIG. 9b is a flow diagram of an alternate preferred method of the present invention.

FIG. 9b is a flow diagram 86 of an alternate method to measure the curvature of a workpiece using the present invention. The process begins at step 88 and, in a step 90, a blank wafer is scanned with a first beam from a first laser source. The blank wafer does not have a thin film deposited on its surface. In a step 92, the CPU selects a second laser source and scans the blank wafer with a second beam having a different wavelength than the first beam. In step 94, a thin film is deposited on the wafer using well known techniques. In step 96, the deposited wafer is scanned again by the first beam from the first laser source. In step 98, the deposited wafer is scanned by the second beam from the second laser source. In step 100, the CPU uses the entire set of data from the four scans to calculate the curvature of the wafer. The CPU can subtract the sets of data describing the blank wafer from the sets of data describing the deposited wafer to eliminate the effects of the intrinsic curvature of the surface that existed before deposition. After the curvature of the wafer surface is calculated, the process is complete as indicated in step 102.

Figure 10:
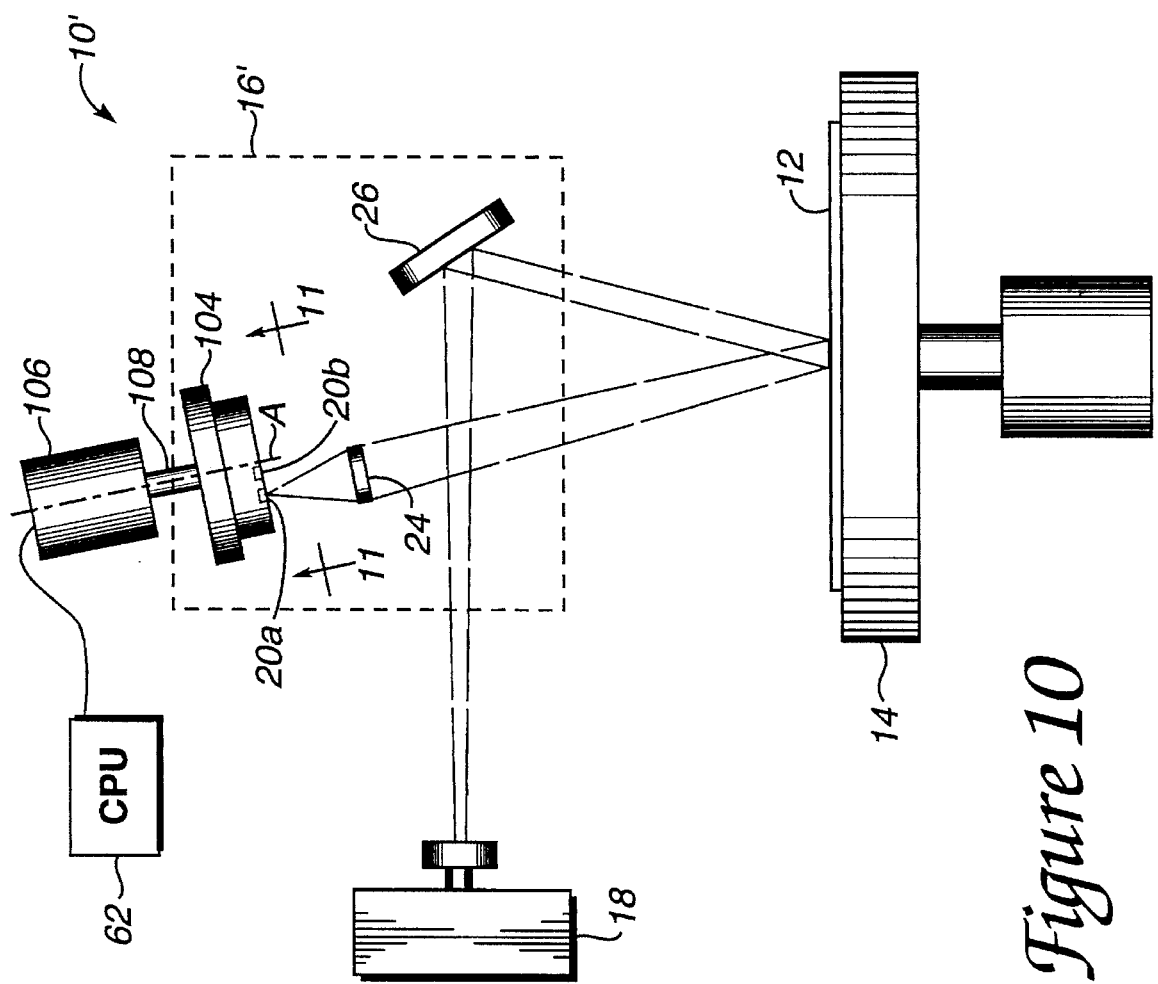
FIG. 10 is a schematic diagram of a first alternate embodiment of the apparatus to measure curvature.

FIG. 10 is a front elevational view of an alternate embodiment of the present invention. Apparatus 10' includes a laser head 16', a detector 18, a motor 106, and a detector 18. Laser head 16' includes a carousel 104 that houses two laser sources 20a and 20b. Each of the laser sources 20a and 20b can direct a laser beam having a different wavelength from the other laser source. The carousel can preferably be rotated about central axis A by motor 106, which is coupled to carousel 104 by a spindle 108. Laser sources 20a and 20b may be alternately positioned above lens 24 to project a beam 29a or 29b onto wafer 12. Motor 106 is preferably controlled by CPU 62, which can select a laser source 20a or 20b by rotating carousel 104. Detector 18 and mirror 26 are similar to equivalent components described with reference to FIGS. 1 and 2. This embodiment requires only one lens and one mirror, and thus reduces the number of components from the apparatus shown in FIGS. 1 and 2. However, the carousel 104 is more difficult to construct and implement than the apparatus of FIGS. 1 and 2. The remainder of the apparatus 10' operates in a manner similar to apparatus 10 described previously.

Figure 11:
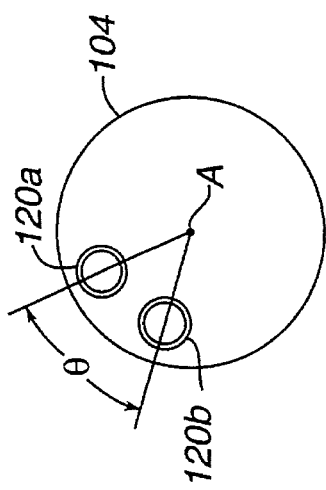
FIG. 11 is a detailed view of a laser carousel used in the apparatus of FIG. 10 as seen along line 11—11.

FIG. 11 is a bottom view of carousel 104 taken along line 11—11 of FIG. 10. Laser sources 20a and 20b are preferably positioned along the circumference of carousel 104 so that one source 20a or 20b may be positioned above lens 24 (FIG. 10) at one time by rotating carousel 104 about axis A by an angle $\theta$. If more than two laser sources 20a and 20b are being used, the additional sources can be positioned similarly along the edge of carousel 104 and accessed by rotating the carousel 104 by an appropriate angle.

Figure 12:
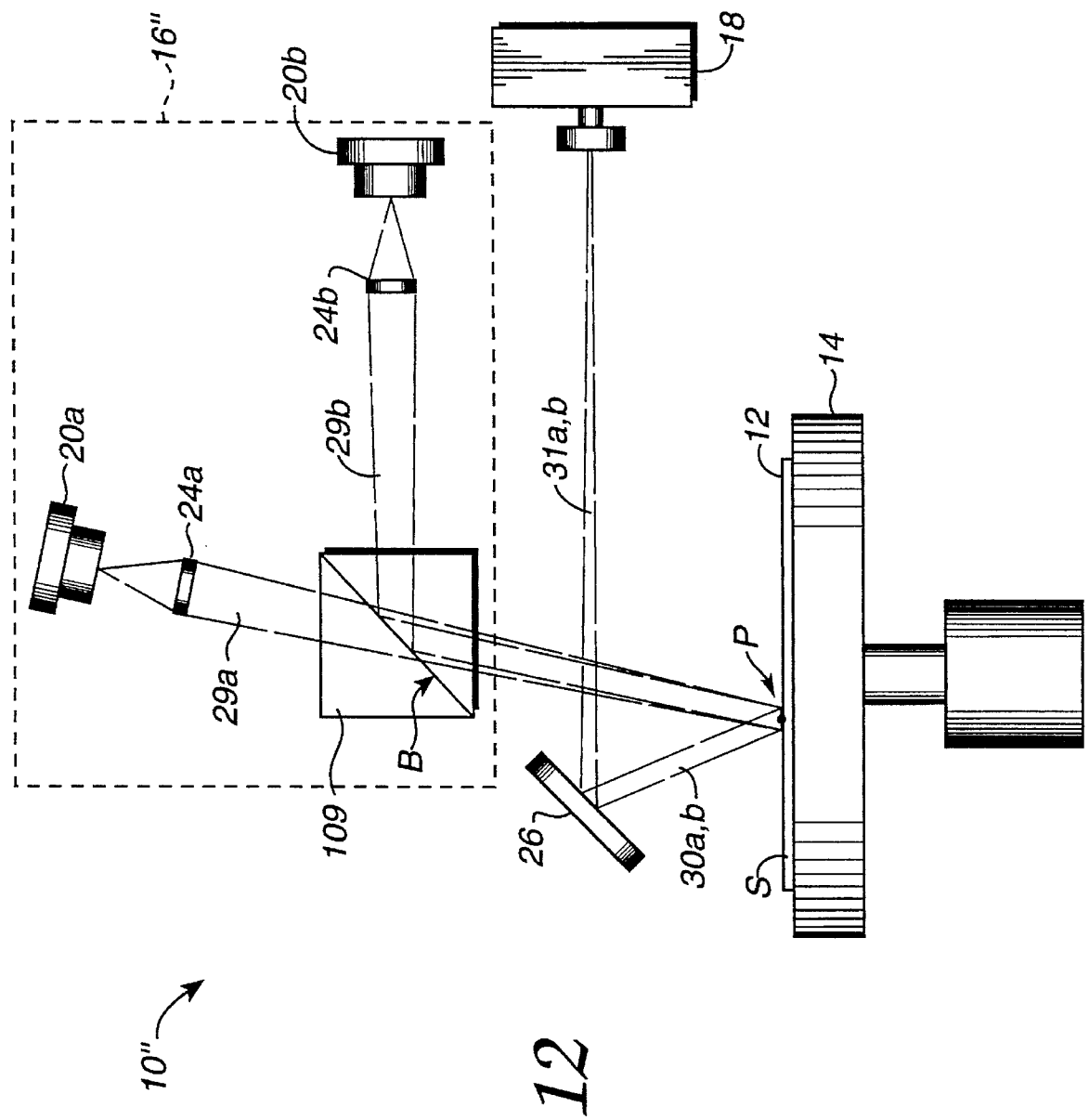
FIG. 12 is a schematic diagram of a second alternate embodiment of the apparatus to measure curvature.

FIG. 12 is a front elevational view of a second alternate embodiment of the present invention. Apparatus 10" includes a laser head 16" and a detector 18. Laser head 16" includes laser sources 20a and 20b, lens 24a and 24b, mirror 26, and beamsplitter 108. Laser sources 20a and 20b, lens 24a and 24b, and mirror 26 are similar to those components described with reference to FIGS. 1 and 2. Beamsplitter 108 is preferably a polarizing beamsplitter that is positioned to intercept beams 29a and 29b projected from laser sources 20a and 20b. Polarizing beamsplitters suitable for use with the present invention can be obtained from Mellis Griot. Laser source 20a preferably projects a laser beam having S-polarization, i.e., the electric field of beam 29a is vibrating in a direction so that the beam will be transmitted entirely through beamsplitter 108. Laser source 20b preferably projects a laser beam having P-polarization, i.e., the electric field of beam 29b is vibrating in a direction at right angles to the vibration of the electric field of beam 29a so that beam 29b is entirely reflected by beamsplitter 108. Laser sources 20a and 20b are preferably positioned so that beam 29a impinges on surface B from one side, and beam 29b impinges on surface B from the other side. As shown in FIG. 12, beam 29a is transmitted through the beamsplitter 108 with no reflection from surface B. Beam 29b, however, is reflected from surface B to impinge on the same point P on wafer surface S. Thus, in this embodiment, only one mirror 26 is required, since beamsplitter B directs the beams accordingly to impinge on the single mirror. One beam 29a or 29b is projected through beamsplitter 108 at one time, followed by the projection of the other beam. In an alternate embodiment, a non-polarizing beamsplitter is used. When using a non-polarizing beamsplitter, the beams 29a and 29b do not have to be S- and P-polarized as described above. However, the beams lose some intensity when directed through the non-polarizing beamsplitter. Again, the remainder of apparatus 10" operates similarly to apparatus 10' and 10 described previously.

While this invention has been described in terms of several preferred embodiments, it is contemplated that alterations, modifications and permutations thereof will become apparent to those skilled in the art upon a reading of the specification and study of the drawings. It is intended that the claims include all such alterations, modifications and permutations as fall within the spirit and scope of the present invention.

What is claimed is:

1. An apparatus for measuring the curvature of a workpiece surface comprising:

a plurality of laser sources, each laser source providing a laser beam having a distinct wavelength, wherein each of said laser sources provides a laser beam having a different wavelength from beams emitted by other laser sources of said plurality of laser sources;

means for selecting only a first one of said plurality of laser sources to form a first beam having a first wavelength;

means for directing said beam to a surface of a workpiece;

means for imparting relative motion between said beam and said workpiece such that said beam scans a selected portion of said workpiece;

a detector for detecting a reflected portion of said beam at a plurality of points on said workpiece as said beam scans said selected portion of said workpiece;

means for using a second one of said plurality of laser sources, instead of said first one of said plurality of laser sources to form a second beam having a second wavelength only when an amplitude of said detected reflected portion of said first beam is below a predetermined threshold amplitude, such that said means for directing, said means for imparting, and said detector are operated with said second beam instead of with said first beam; and means for determining curvature of said workpiece based, at least in part, on said reflected portion of said first beam detected by said detector when said detected amplitude of said first beam is above said threshold amplitude, wherein said determination of said curvature is based, at least in part, on said reflected portion of said second beam when said detected amplitude of said first beam is below said threshold amplitude.

2. An apparatus as recited in claim 1 wherein said means for directing said beam includes lens means.

3. An apparatus as recited in claim 2 wherein said means for directing said beam includes means for reflecting a portion of said beam to said means for detecting.

4. An apparatus as recited in claim 3 wherein said means for reflecting includes a plurality of mirrors, wherein each of said plurality of mirrors is associated with one of said laser sources.

5. An apparatus as recited in claim 2 wherein said means for imparting relative motion between said beam and said workpiece includes motor means coupled to said plurality of laser sources and said means for directing said beam.

6. An apparatus as recited in claim 2 wherein said means for imparting relative motion between said beam and said workpiece includes motor means coupled to said workpiece.

7. An apparatus as recited in claim 6 wherein said means for determining curvature of said workpiece includes digital computation means.

8. An apparatus as recited in claim 1 wherein said laser sources are positioned inside a rotatable carousel for moving a selected one of said laser sources into a position where said means for directing can direct said beam emitted from said selected laser source.

9. An apparatus for selecting a laser beam for measurement of a workpiece, the apparatus comprising:

a plurality of sources of electromagnetic radiation, each of said sources being operative to emit a beam primarily at a given wavelength, said given wavelength being different from given wavelengths of beams emitted from other sources of said plurality of sources;

means for selecting only one of said plurality of sources at one time to form a first selected beam at substantially a single wavelength;

means for directing said first selected beam to a surface of a workpiece;

means for detecting a reflection of said first selected beam;

means for using a second one of said plurality of sources at one time to form a second selected beam having a different wavelength than said first selected beam, said second one of said sources being used only when an amplitude of said reflection of said first selected beam is below a predetermined threshold amplitude.

10. An apparatus as recited in claim 9 wherein said plurality of sources include a plurality of laser sources.

11. An apparatus as recited in claim 10 wherein said laser sources are positioned inside a rotatable carousel for moving a selected one of said laser sources into a position where said means for directing can direct said beam emitted from said selected laser source.

12. An apparatus as recited in claim 10 wherein said means for selecting includes a digital controller coupled to said laser sources.

13. An apparatus as recited in claim 10 wherein said means for directing said beam includes a converging lens associated with each of said sources and means for adjusting the focus of each of said converging lens.

14. An apparatus as recited in claim 13 wherein said means for directing said beam includes a plurality of mirror means, each of said mirror means corresponding to one of said laser sources.

15. An apparatus as recited in claim 9 wherein said means for directing said beam includes a beam splitter operative to reflect at least one of said beams onto said surface and transmit at least one of said beams onto said surface.

16. An apparatus for measuring the curvature of a workpiece surface comprising:

a plurality of laser sources of electromagnetic radiation, each laser source providing a laser beam having a distinct wavelength different from wavelengths of beams emitted by other laser sources of said plurality of laser sources;

means for selecting only a first one of said plurality of laser sources to direct a first beam having a first wavelength to a surface of a blank workpiece;

means for scanning said first beam across a selected portion of said blank workpiece and detecting a reflected portion of said first beam at a plurality of points on said blank workpiece as said first beam is scanned to provide first beam blank data;

means for selecting only a second one of said plurality of sources to direct a second beam having a second wavelength onto said blank workpiece, such that said means for scanning and detecting is operated with said second beam to provide second beam blank data;

means for providing said workpiece after said workpiece has been deposited with a thin film, wherein said means for selecting and said means for scanning and detecting are used to scan only said first beam on said deposited workpiece to provide first beam deposited data, and wherein said means for selecting and said means for scanning and detecting are used to scan only said second beam on said deposited workpiece to provide second beam deposited data; and means for determining curvature of said deposited workpiece by subtracting said first beam blank data from said first beam deposited data to provide first beam corrected data, subtracting said second beam blank data from said second beam deposited data to provide second beam corrected data, and utilizing one of said first beam corrected data and said second beam corrected data to calculate said curvature of said workpiece.

17. An apparatus as recited in claim 16 wherein said first beam corrected data is used to determine said curvature of said workpiece when said first beam corrected data has a greater amplitude than said second beam corrected data, and wherein said second beam corrected data is used to determine said curvature of said workpiece when said second beam corrected data has a greater amplitude than said first beam corrected data.

18. An apparatus as recited in claim 17 wherein said means for scanning includes means for imparting relative motion between said first beam and said workpiece such that said first beam scans a selected portion of a workpiece, and wherein said means for imparting is also operative to imparts relative motion between said second beam and said workpiece such that said second beam scans a selected portion of a workpiece.

19. An apparatus as recited in claim 17 wherein said first and second laser sources are positioned inside a rotatable carousel for moving a selected one of said laser sources into a position where said means for scanning can scan said beam emitted from said selected laser source.

20. An apparatus as recited in claim 17 wherein said laser sources include a converging lens associated with each of said laser sources and means for adjusting the focus of each of said converging lens.

21. An apparatus as recited in claim 20 wherein said means for scanning and detecting includes a plurality of mirror means, each of said mirror means corresponding to one of said laser sources.

22. An apparatus for measuring parameters of a surface of a workpiece comprising:

a first laser source capable of producing a first beam at a first primary frequency that can be directed at a surface of a workpiece;

a second laser source capable of producing a second beam at a second primary frequency that can be directed at said surface of said workpiece, said second primary frequency being different from said first primary frequency;

a controller coupled to said first laser source and said second laser source and operative to turn on said first laser source to produce said first beam without turning on said second laser source;

a detector coupled to said controller and responsive to a reflection of said first beam to produce a signal indicative of a reflected signal amplitude level of said first beam, such that said controller can determine whether said first reflected signal amplitude level is sufficient, said controller automatically turning off said first laser source and turning on said second laser source if said first reflected signal amplitude level is determined by the controller to be insufficient and without regard as to a reflected signal amplitude level of said second laser source; and a scanning mechanism imparting relative motion between said surface of said workpiece and said first beam if said first reflected signal amplitude level is determined to be sufficient and said second beam if said first reflected signal amplitude level is determined to be not sufficient, such that said detector can detect reflections from said surface of said workpiece to derive parameters describing the surface therefrom.

23. An apparatus for measuring parameters as recited in claim 22 wherein said first laser source develops a beam having a primary wavelength within the range of about 810–830 nm, and wherein said second laser source develops a beam having a primary wavelength within the range of about 670–750 nm.

24. An apparatus for measuring parameters as recited in claim 22 wherein said parameters include a set of curvatures at a multiplicity of points on said surface of said workpiece.

* * * * *